(12) United States Patent
Fujita et al.

(10) Patent No.: US 8,664,861 B1
(45) Date of Patent: Mar. 4, 2014

(54) PLASMA GENERATOR

(71) Applicant: Nissin Ion Equipment Co., Ltd., Kyoto (JP)

(72) Inventors: Hideki Fujita, Kyoto (JP); Tetsuya Igo, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 14/029,196

(22) Filed: Sep. 17, 2013

Related U.S. Application Data

(63) Continuation-in-part of application No. 13/198,429, filed on Aug. 4, 2011, now Pat. No. 8,569,955.

(30) Foreign Application Priority Data

Aug. 24, 2010 (JP) ................................. 2010-186824

(51) Int. Cl.
*H05B 31/26* (2006.01)
(52) U.S. Cl.
USPC .................................................. 315/111.21
(58) Field of Classification Search
USPC ............. 315/111.21, 111.11, 111.31, 111.71, 315/111.81, 111.91; 156/345.38, 345.4, 156/345.43, 345.44, 345.47, 345.48
See application file for complete search history.

(56) References Cited

U.S. PATENT DOCUMENTS

| | | |
|---|---|---|
| 6,452,198 B1 | 9/2002 | Mani et al. |
| 6,852,990 B1 | 2/2005 | Zhao et al. |
| 7,342,240 B2 | 3/2008 | Walther et al. |
| 2007/0137576 A1 | 6/2007 | Kurunczi et al. |
| 2009/0317566 A1* | 12/2009 | Nishimoto .................... 427/575 |

FOREIGN PATENT DOCUMENTS

JP    2002-324511 A1    11/2002

* cited by examiner

*Primary Examiner* — Minh D A
(74) *Attorney, Agent, or Firm* — Procopio, Cory, Hargreaves & Savitch LLP

(57) ABSTRACT

A plasma generator generates a plasma by ionizing a gas with a high-frequency discharge in a plasma generating chamber so that electrons from the plasma are emitted outside the plasma generator through an electron emitting hole. The plasma generator includes an antenna that is provided in the plasma generating chamber and that emits a high-frequency wave, and an antenna cover that is made of an insulating material and that covers an entire body of the antenna. A plasma electrode having the electron emitting hole is made of a conductive material. A frame cover with a protrusion ensures conductivity by preventing an insulating material from accumulating on a surface of the plasma electrode on a plasma side in sputtering by the plasma.

3 Claims, 6 Drawing Sheets

Section A-A

PLASMA GENERATOR

This application is a continuation-in-part of U.S. patent application Ser. No. 13/198,429, filed Aug. 4, 2011, now U.S. Pat. No. 8,569,955 claiming priority to Japanese Patent Application No. 2010-186824, filed Aug. 24, 2010, the contents of which is incorporated by reference in its entirety.

BACKGROUND OF THE INVENTION

1. Field of the Invention

The present invention relates to a high-frequency discharge plasma generator that is used for suppressing an electrostatic charge (charge-up), etc., on a surface of a substrate when ion beam irradiation is carried out in an ion beam irradiation device that performs ion implantation, etc., by, for example, irradiating the substrate with an ion beam.

2. Description of the Related Art

A plasma generator is disclosed in Japanese Patent Application Laid-open No. 2002-324511 (Paragraphs 0031 to 0038 and FIG. 1) as an example of a high-frequency discharge plasma generator described above used for suppressing an electrostatic charge on a surface of a substrate. The disclosed plasma generator generates a plasma by ionizing a gas with a high-frequency discharge in a plasma generating chamber. As a result, electrons from the plasma are emitted outside the plasma generating chamber through electron emitting holes. In this plasma generator, an inner wall and an antenna of the plasma generating chamber are covered with an insulator to prevent metal contamination produced in sputtering by the plasma and adhering of the conductive sputtered material to the antenna.

The principal object of providing the insulator on the inner wall is to prevent contamination (that is, metallic contamination) of the plasma from occurring. That is, to prevent particles of metal constituting the inner wall being discharged in the plasma from the antenna in sputtering by the plasma.

Alumina, etc., is used as the material of the insulator. An extracting power supply 56 is connected between a plasma electrode 16, which has electron emitting holes, and a target chamber 8. The plasma electrode 16 is made of a conductive material such as carbon. A current that flows through the extracting power supply 56 is called a PFG current Ipfg and is a measure of the electrons that are emitted to the outside through electron emitting holes 18.

The plasma electrode 16 is in contact with a plasma 20 and is operative to ensure an electric potential of the plasma 20. The electric potential of the plasma electrode 16 is set the same as that of a plasma generating chamber 12. When the plasma generating chamber 12 is internally completely covered with the insulator, no conductor is in contact with the plasma 20, no current flows in the plasma 20, and the electrons can hardly be extracted from the plasma 20. However, the plasma electrode 16 can prevent such situations from occurring.

If the plasma generator 10 is driven for a prolonged period (for example, approximately a few hundred hours to a few thousand hours), the PFG current decreases to such an extent so as to be of no use.

If the PFG current Ipfg decreases as described above and neutralization of charge-up of the substrate cannot be performed adequately, the plasma generator has to be removed for clearing the insulating material accumulated on the plasma electrode 16. This results in stoppage of the ion beam irradiation device for maintenance for a long time.

A plasma is a good conductor and by itself is quasi-neutral. Therefore, an electron current lost from the plasma and an ion current are always equal in magnitude. Because a decrease in plasma electrons takes place due to extraction of an electron current from a PFG (PFG current Ipfg), the same amount of ions needs to be lost from the plasma.

Although the ions can obtain the electrons by recombining in the plasma, the electron current lost from the plasma cannot be compensated. An ion current flow is initiated only when the ions collide against the wall, releasing the electrons from the wall.

When the ions collide against the wall, the ions recombine with the electrons at the wall and are converted back into a neutral gas. These electrons are supplied by a PFG power supply 30 through a conductive wall. The PFG power supply 30 also extracts electrons from the PFG, and supplies an amount of electrons to a PFG plasma via the ions that is equal to the amount of electrons that flow into a vacuum chamber. As a result, an outflow current is maintained equal to a feedback current of the power supply.

If the material of the frame cover is conductive and made of carbon and electrically connected to the plasma generating chamber or plasma electrode, then even if plasma is not in contact with plasma electrode 16, if the inner wall of the frame cover made by the frame cover protrusions does not become insulating and is in contact with plasma, and PFG current Ipfg will flow.

SUMMARY OF THE INVENTION

One plasma generator according to this invention makes the PFG current Ipfg not decrease by ionizing a gas using high-frequency discharge within a plasma generating chamber to generate plasma and discharge electrons externally from that plasma through an electron discharge hole, equipping the plasma generator with an antenna installed in the plasma generating chamber that radiates high-frequency waves and an antenna cover that covers the entire antenna and is comprised of an insulating material, in a plasma generator in which the plasma electrode material that has the electron discharge hole is comprised of conductive material, between the plasma electrode and the antenna, in the cylindrical frame region, a frame cover is provided that has protrusions of different thicknesses that are on the inner side or the inner and outer sides of the frame, the material of the frame cover being an insulating material, the frame cover protrusions that are near the top surface of the plasma electrode that is near the frame cover forming shadows near the top surface of the plasma electrode, and those shadows preventing accumulation of insulating material on the plasma electrode due to sputtering by the plasma.

The frame cover should preferably be made of a conductive material such as carbon. The frame cover should also be electrically connected to the plasma generator or the plasma electrode. The conductive frame cover also functions as an electrode, increasing a surface area of the conductive wall, and as a result, increasing the PFG current Ipfg. The PFG current Ipfg flows until a point in time at which the entire surface of the plasma electrode and the frame cover are coated with the insulating material. Thus, the life of the plasma generator can be prolonged not only by preventing the insulation of the plasma electrode but also by increasing the PFG current Ipfg. The carbon can be pyrolytic graphite having strong plasma resistant properties.

Another plasma generator according to this invention makes the PFG current Ipfg not decrease by ionizing a gas using high-frequency discharge within a plasma generating chamber to generate plasma and discharge electrons externally from that plasma through an electron discharge hole, equipping the plasma generator with an antenna installed in the plasma generating chamber that radiates high-frequency waves and an antenna cover that covers the entire antenna and is comprised of an insulating material, in a plasma generator in which the plasma electrode material that has the electron discharge hole is comprised of conductive material, between the plasma electrode and the antenna, in the cylindrical frame region, a frame cover is provided that has protrusions of different thicknesses that are on the inner side or the inner and outer sides of the frame, the material of the frame cover being made of carbon, the frame cover being electrically connected to the plasma generating chamber or the plasma electrode, the frame cover protrusions forming shadows on the inner wall of the frame cover, and those shadows preventing accumulation of the insulating material of the frame cover due to sputtering by the plasma.

In view of the above discussion, because the object is to only increase the surface area that is in contact with the plasma, the plasma electrode can be arranged at any position as long as it is in contact with the plasma, for example, at the edge of the plasma.

DETAILED DESCRIPTION OF THE PREFERRED EMBODIMENTS

Figure 1:
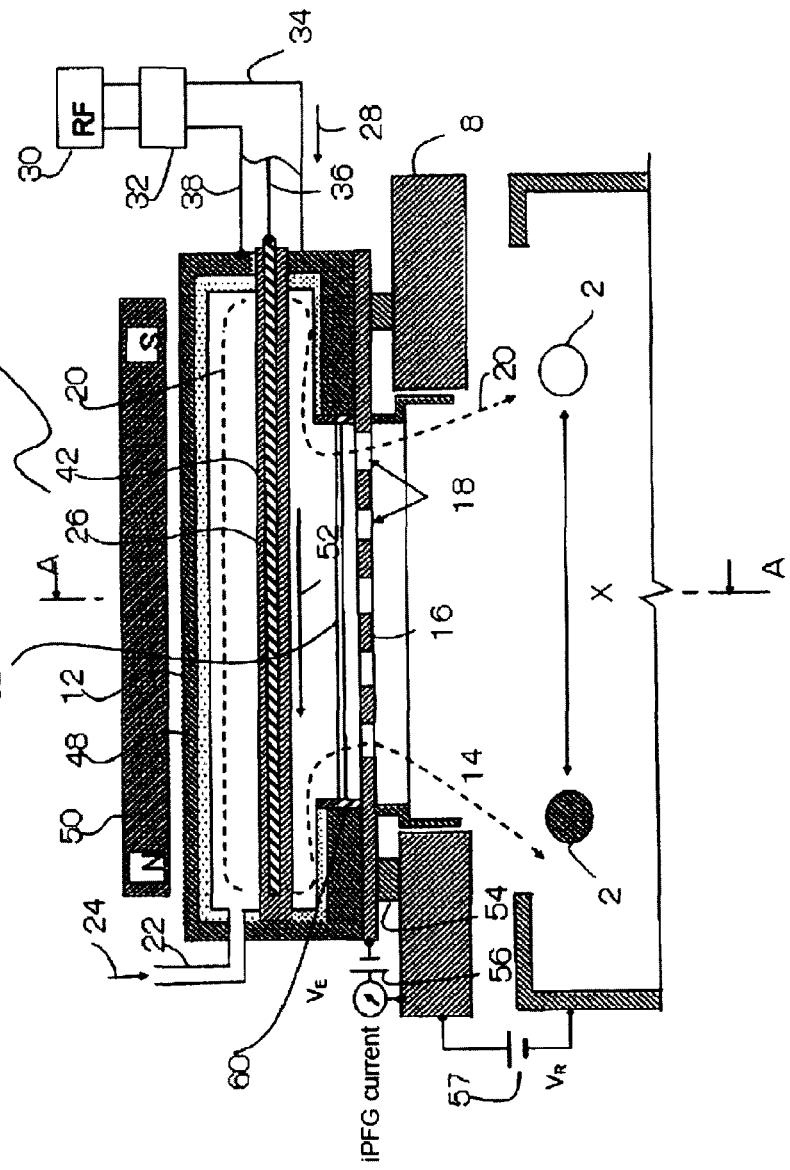
FIG. 1 is a cross-sectional view of a plasma generator according to an embodiment of the present invention.
Figure 2:
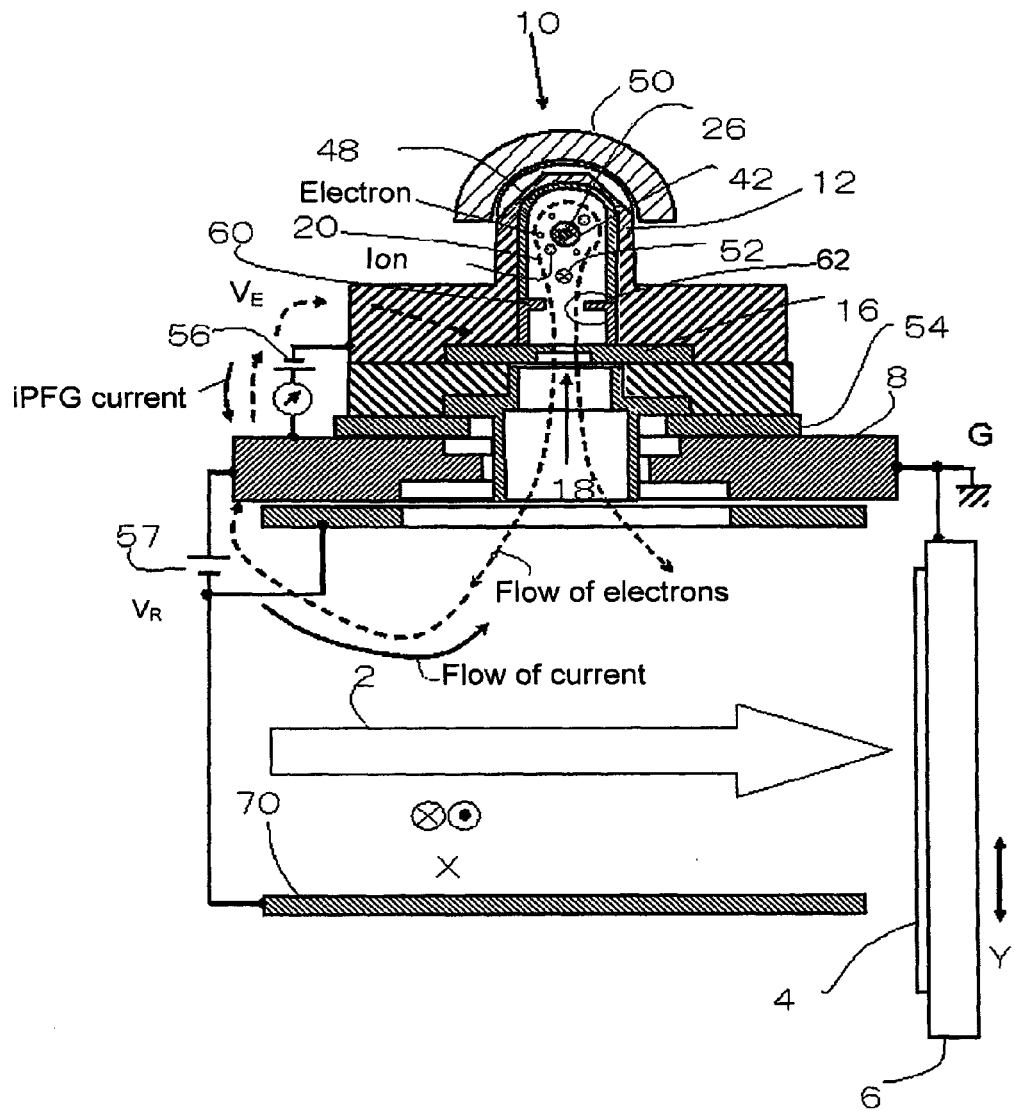
FIG. 2 is a cross-sectional view taken along a line A-A of FIG. 1.

Exemplary embodiments of a plasma generator according to the present invention are explained below with reference to the accompanying drawings. In FIGS. 1 and 2, a configuration is explained as an example in which a plasma generator 10 is used in an ion beam irradiation device (this device is called an ion implantation apparatus when ion implantation is performed) that performs a process of ion implantation, etc., into a substrate 4 by irradiating the substrate (for example, semiconductor substrate) 4 with an ion beam 2 in a target chamber 8. The plasma generator 10 is attached outside the target chamber 8 located in the vicinity of an upstream side of the substrate 4 via an insulator 54.

In this example, the ion beam 2 is reciprocally scanned in an X direction (for example, horizontal direction) by the action of an electric field or a magnetic field. The substrate 4 is secured to a holder 6, and reciprocally scanned in a mechanical manner in a Y direction (for example, orthogonal direction) that crosses the X direction. Due to the coordination of both of the scanning systems (hybrid scanning), an entire surface of the substrate 4 is uniformly irradiated with the ion beam 2, thus enabling a highly uniform ion implantation to be performed.

While the substrate 4 is being scanned, electrons in a plasma emitted from the plasma generator 10 are supplied to the vicinity of the ion beam 2 or the substrate 4. These electrons neutralize a positive charge caused by ion beam irradiation, thereby suppressing an electrostatic charge on the surface of the substrate 4.

To cope with the scanning of the ion beam 2 in the X direction, the plasma generator 10 of the present embodiment has a structure that is elongated in the X direction. Thus, the electrons in the plasma that is wide in the X direction are emitted and uniformly supplied to the vicinity of the ion beam 2 scanned in the X direction. As a result, the electrostatic charge on the surface of the substrate 4 can be uniformly suppressed.

The plasma generator 10 includes a cylindrical plasma generating chamber 12 (specifically, semicylindrical) that is elongated along the X direction. The plasma generating chamber 12 is made of a non-magnetic material. The non-magnetic plasma generating chamber 12 does not disturb a magnetic field 52 generated by a magnet 50, which is described later. A plasma electrode 16 is also made of a non-magnetic material.

A gas introducing pipe 22 is connected to one end of the plasma generating chamber 12 (on a left side in FIG. 1). A gas 24, for example, xenon, is introduced into the plasma generating chamber 12 from the gas introducing pipe 22.

The plasma generating chamber 12 has an opening 14 in a portion, specifically, on a lower side (the side facing the ion beam 2) of the plasma generating chamber 12. The plasma electrode 16 is provided in the opening 14. The plasma electrode 16 has an electron emitting hole 18 through which the electrons in the plasma generated in the plasma generating chamber 12 are emitted outside the plasma generating chamber 12. In the present embodiment, the electron emitting hole 18 includes a plurality of holes (for example, circular holes or elongated holes) arranged in a line in the X direction. Alternatively, the electron emitting hole 18 can be a slit extending along the X direction. The plasma electrode 16 is electrically connected to the plasma generating chamber 12, and has the same electric potential as the plasma generating chamber 12.

A straight rod-like antenna 26 is provided in the plasma generating chamber 12. The antenna 26 extends along a longitudinal axis of the plasma generating chamber 12, that is, along the X direction. A length of the antenna 26 in the plasma generating chamber 12 is, for example, about 80% to 100% of a length of the plasma generating chamber 12 along the longitudinal axis. The antenna 26 is inserted into the plasma generating chamber 12, for example, from the other end (right side in FIG. 1) of the plasma generating chamber 12. The antenna 26 is made of, for example, tungsten. The antenna 26 is covered with an antenna cover 42, or some other insulator (not shown), thereby electrically insulating the antenna 26.

A high-frequency wave 28 is supplied from a PFG power supply 30 to the antenna 26 via an impedance matching circuit 32 and a coaxial cable 34. The high-frequency wave 28 can be a high frequency wave of approximately 13.56 megahertz (MHz) or a microwave of a frequency of approximately 2.45 gigahertz (GHz). That is, high frequency in the present description encompasses frequencies in the microwave band. A central conductor 36 and an outer conductor 38 of the coaxial cable 34 are, respectively, electrically connected to the antenna 26 and the plasma generating chamber 12.

With the structure described above, the high-frequency wave 28 supplied to the antenna 26 from outside is emitted from the antenna 26 into the plasma generating chamber 12 and a plasma 20 is generated by ionizing the gas 24 with a high-frequency discharge in the plasma generating chamber 12. As a result, the electrons in the plasma 20 are emitted into the target chamber 8 through the electron emitting hole 18.

A negative extracting voltage $V_E$ can be applied to the plasma generating chamber 12 and the plasma electrode 16 having the same electric potential as that of the plasma generating chamber 12, using a direct current extracting power supply 56 with an electric potential of the target chamber 8 as a reference. This configuration allows easy emission of the electrons from the electron emitting hole 18.

With the electric potential of the target chamber 8 as the reference, a negative reflector voltage $V_R$ can be applied to a reflector 70 using a power supply 57. As a result, the electrons in the plasma emitted from the electron emitting hole 18 are reflected by the reflector 70, and are easily captured by the ion beam 2.

The entire antenna 26 located inside the plasma generating chamber 12 is covered with the antenna cover 42 that is made of an insulating material. The antenna cover 42 is made of ceramic such as silica and alumina. Thus, contamination in which metal particles constituting the antenna 26 are discharged from the antenna 26 in sputtering by the plasma 20, to contaminate the plasma, can be prevented from occurring.

According to the present embodiment, it is desirable to cover an inner wall (that is, an inner wall excluding the opening 14) of the plasma generating chamber 12 with an insulator 48. When the electron emitting hole 18 is provided on a side face of the plasma generating chamber 12 instead of providing to the plasma electrode 16, it is desirable to cover the inner wall of the plasma generating chamber 12 excluding the electron emitting hole 18 with the insulator 48. Thus, contamination, in which metal particles constituting the plasma generating chamber 12 are discharged from the plasma generating chamber 12 in sputtering by the plasma 20, to contaminate the plasma, can be prevented from occurring.

A frame cover 60 with a protrusion 62 is provided inside the plasma generating chamber 12 so as to cover a periphery of the plasma electrode 16. Due to this, the insulating material is prevented from accumulating on the surface of the plasma electrode 16 in sputtering by the plasma 20, and conduction is ensured.

Figure 3:
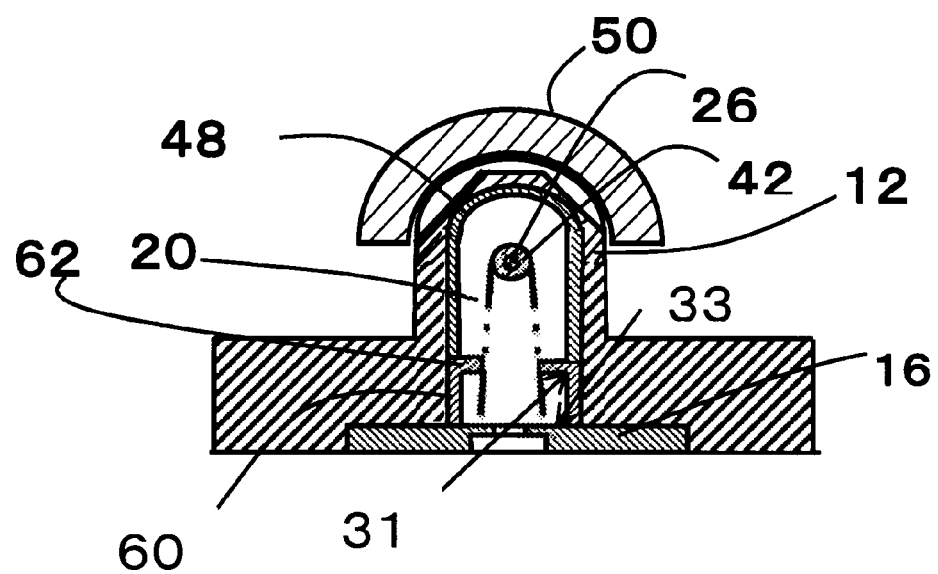
FIG. 3 shows how the shadow of the frame cover protrusion is formed near the top surface of the plasma electrode and on the inner wall of the frame cover.

FIG. 3 illustrates a shadow 31, 33 formed by the protrusion 62 of the frame cover 60 near the top surface of the plasma electrode 16. The shadow 31, 33 prevents accumulation of insulating material on the plasma electrode 16 that would typically be associated with sputtering by the plasma 20. The shadow 31, 33 may be formed on the inner wall of the frame cover 60, or near the top surface of the plasma electrode 16.

According to a first implementation, and as can be seen in FIG. 3, the plasma generating chamber 12 includes an insulator 48 having the frame cover 60 with the protrusion 62. The frame cover 60 is electrically connected to one of the plasma generating chamber 12 and the plasma electrode 16. The antenna 26 emits a high-frequency wave (not shown) that ionizes a gas (not shown), and generates plasma 20. The protrusion 62 blocks the plasma 20 from accumulating on the plasma electrode 16 in the shadow region 31, 33 that is formed near the top surface of the plasma electrode 16. By preventing the accumulation, conduction is ensured.

In another example implementation, the frame cover 60 may be made of carbon, and the frame cover 60 is electrically connected to the plasma generating chamber 12 or the plasma electrode 16. According to this example implementation, the location of the shadow 31, 33 is at the inner wall of the frame cover 60, and prevents accumulation of the insulating material on the frame cover 60.

When the insulating material accumulates on the plasma electrode 16, the conductor cannot contact with the plasma 20, the electric potential cannot be applied to the plasma 20, no current flows in the plasma 20, and the electrons are hardly extracted from the plasma 20. The frame cover 60 with the protrusion 62 is located between the plasma electrode 16 and the antenna 26. The protrusion 62 has different thicknesses inside a frame or inside and outside the frame within the frame having a tubular frame area.

Figure 4:
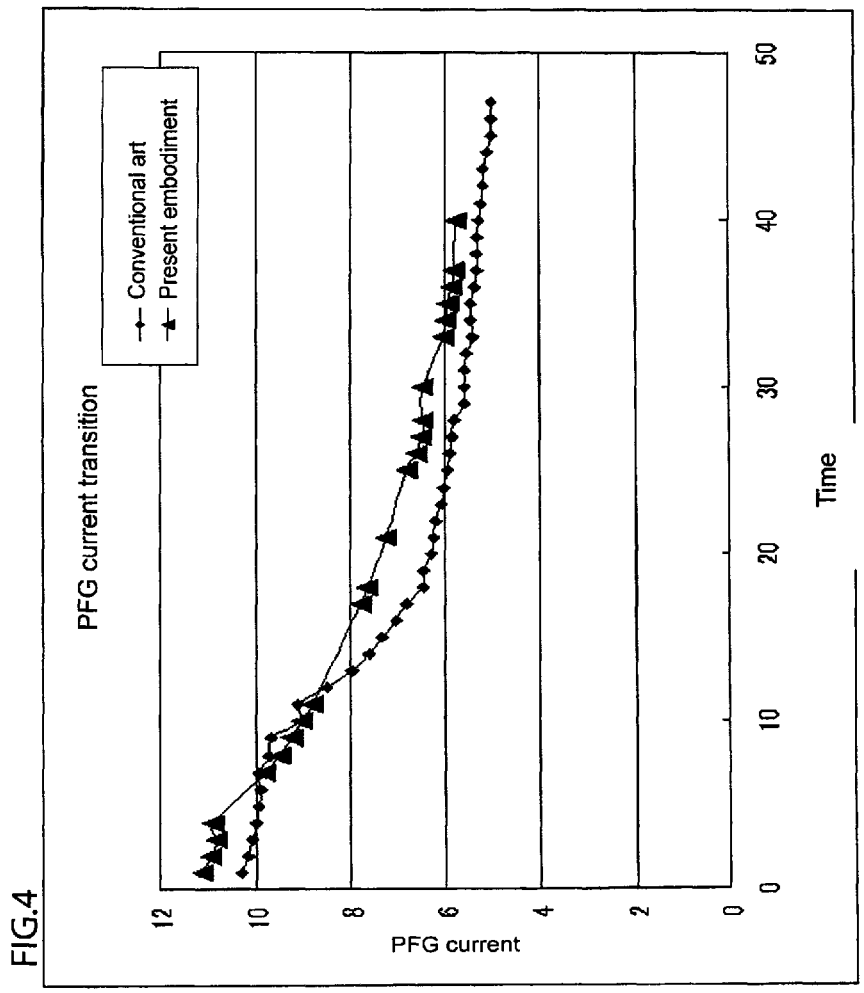
FIG. 4 is a graph that depicts a change in a PFG current before and after the implementation of the invention.

FIG. 4 is a graph that depicts a change in a PFG current Ipfg when the frame cover 60 with the protrusion 62 and when a frame cover 60 without protrusion are provided. As can be seen from FIG. 4, when the frame cover 60 with protrusion 62 is provided, a larger PFG current Ipfg is generated. Therefore, a life of the plasma generator 10 is increased.

Figures 5A, 5B, 5C, 5D:
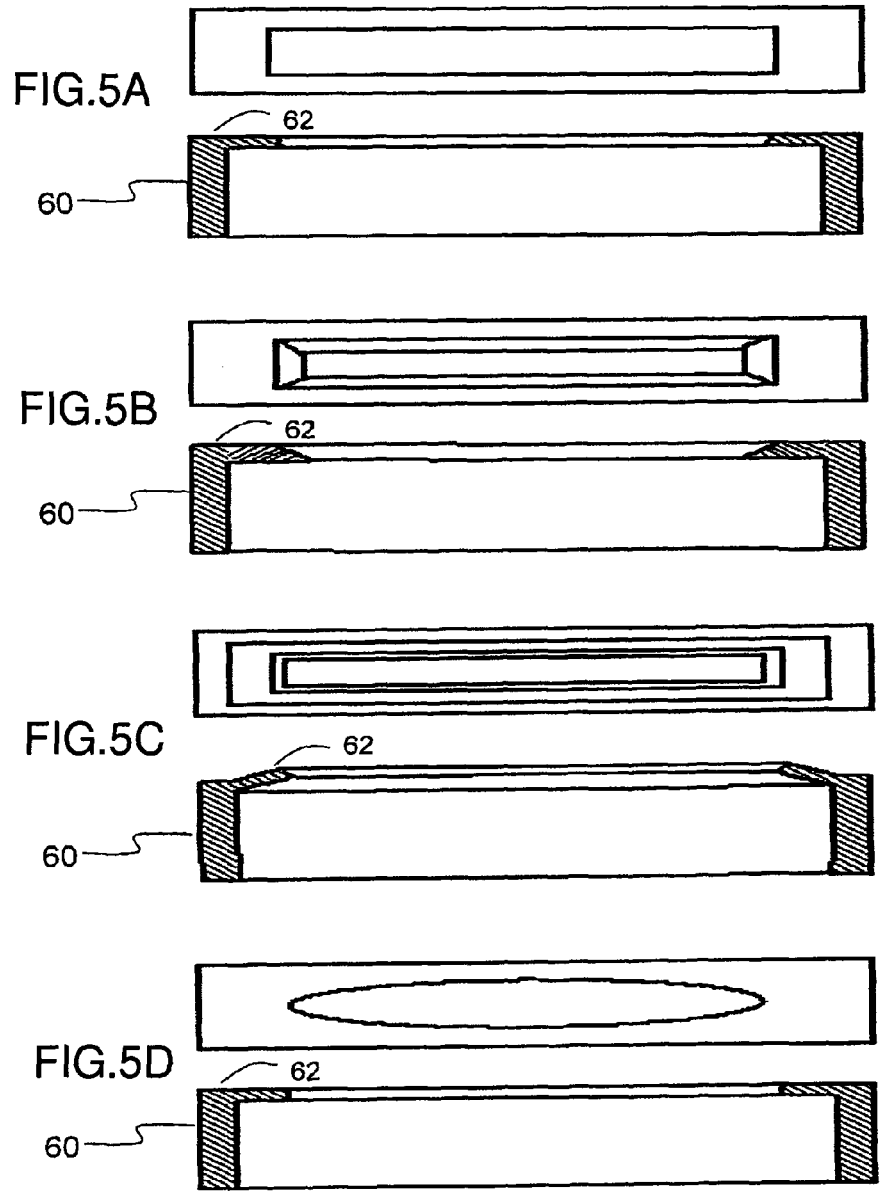
FIGS. 5A to 5D are drawings that depict examples of shapes of a frame cover with protrusion.

FIGS. 4a to 4d are drawings that depict examples of shapes of the frame cover 60 with the protrusion 62. Protrusions of various shapes that form a shadow on the periphery of the plasma electrode 16 are shown in FIGS. 5a to 5d. FIG. 5a illustrates an example of the protrusion 62 from a top view and a side view. The protrusion 62 has a substantially rectangular cross-section, and a substantially rectangular space is formed. FIG. 5b illustrates an example of the protrusion 62 from a top view and a side view. The protrusion 62 has a substantially beveled profile, such that the space formed within the protrusion 62 is substantially rectangular and beveled. FIG. 5c illustrates an example of the protrusion 62 from a top view and a side view. The protrusion has a diagonally upward projecting profile, such that the space formed within the protrusion 62 is substantially rectangular and upwardly projecting. FIG. 5d illustrates an example of the protrusion 62 from a top view and a side view. The protrusion has a substantially rectangular cross section, and the space formed within the protrusion 62 is substantially circular."

Figure 6:
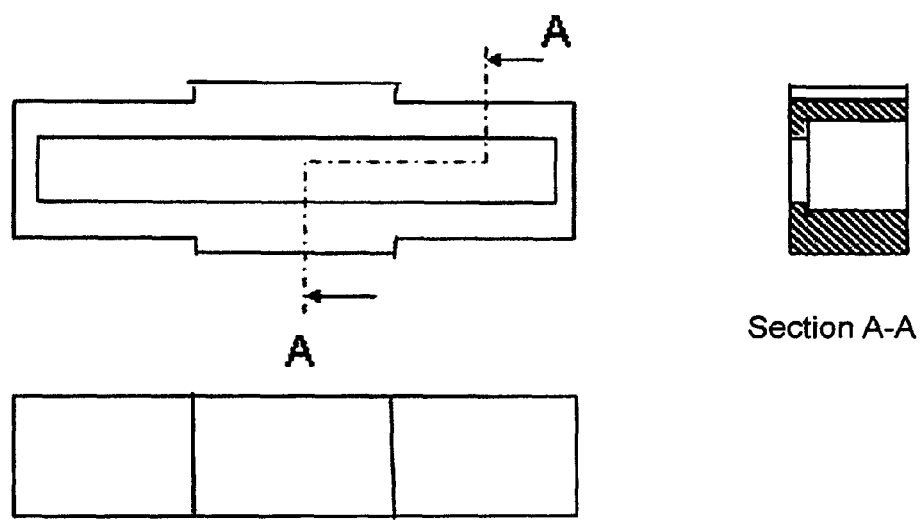
FIG. 6 is a drawing that depicts an example of a shape of the frame cover with protrusion that is outwardly convex.

FIG. 6 is a drawing that depicts an example of a shape of the frame cover 60 with protrusion 62 that is outwardly convex in a central portion. Due to spring characteristics of the frame cover 60, electric contact between the frame cover 60 with the protrusion 62 and the plasma generating chamber 12 can be maintained, and furthermore, the frame cover 60 with protrusion 62 also has the same electric potential as that of the plasma electrode 16. Because the plasma 20 is in contact with a conductive wall, the PFG current Ipfg flows.

The magnet 50, which generates the magnetic field 52 along the longitudinal axis of the plasma generating chamber 12, can be arranged outside the plasma generating chamber 12 as in the present embodiment or inside the plasma generating chamber 12. In the present example, the magnet 50 has a semi-cylindrical shape that conforms with the shape of the plasma generating chamber 12. The magnet 50 is typically a permanent magnet. Provision of the magnet 50 facilitates capturing of the electrons by the magnetic field 52 generated by the magnet 50, and generation and maintenance of the plasma 20 inside the plasma generating chamber 12. Therefore, a high density plasma can be produced by electron cyclotron resonance (ECR).

According to an aspect of the present invention, a shadow near the top surface of a plasma electrode that has an electron discharge hole can prevent accumulation of insulating material on the plasma electrode due to sputtering by the plasma, and thereby, a decrease in the PFG current can be prevented. As a result, a plasma generator can be used for a prolonged time.

According to an aspect of the present invention, a shadow over a plasma electrode having electron emitting holes prevents accumulation of an alumina insulating material on the plasma electrode in sputtering by a plasma, and thereby, a decrease in a PFG current can be prevented. As a result, a plasma generator can be used for a prolonged time.

According to another aspect of the present invention, a frame cover is made of carbon that is electrically conductive.

The conductive frame cover also functions as an electrode, increasing a surface area of a conductive wall, thus increasing the PFG current. The PFG current flows until the entire surface of the plasma electrode and the frame cover are insulated. Thus, the plasma generator can be used for a prolonged time.

According to another aspect of the present invention, the material of the frame cover is made of carbon, the frame cover is electrically connected to the plasma generator or the plasma electrode, the frame cover protrusion forms a shadow on inner wall of the frame cover, and that shadow prevents accumulation of insulating material on the frame cover inner wall due to sputtering by the plasma. According to still another aspect of the present invention, the plasma electrode has a protruding structure. Thus, even if the frame cover with protrusion is not provided, a decrease in the PFG current can be prevented. As a result, the plasma generator can be used for a prolonged time.

According to still another aspect of the present invention, the frame cover internally has depressions of a concave shape. The depressions are not coated with the insulating material easily. Furthermore, because the frame cover is made of carbon, by increasing an area of a conductive wall, the PFG current can be increased.

We claim:

1. A plasma generator that ionizes a gas using high-frequency discharge within a plasma generating chamber to generate plasma and discharges electrons externally using that plasma through an electron discharge hole, wherein the plasma generator is equipped with an antenna installed in the plasma generating chamber that radiates high-frequency waves and an antenna cover that covers the entire antenna and is comprised of an insulating material, in a plasma generator in which the plasma electrode material that has the electron discharge hole is comprised of conductive material, between the plasma electrode and the antenna, in the cylindrical frame region, a frame cover is provided that has protrusions of different thicknesses that are on the inner side or the inner and outer sides of the frame, the material of the frame cover being an insulating material, the ones of the protrusions near a top surface of the plasma electrode and near the frame cover forming shadows near the top surface of the plasma electrode, the formed shadows configured to prevent accumulation of the insulating material on the plasma electrode, the accumulation being associated with sputtering by the plasma.

2. The plasma generator recited in claim 1, wherein the material of the frame cover is made of carbon and the frame cover is electrically connected to one of the plasma generating chamber and the plasma electrode.

3. A plasma generator that ionizes a gas using high-frequency discharge within a plasma generating chamber to generate plasma and discharges electrons externally using that plasma through an electron discharge hole comprising a plasma electrode, wherein the plasma generator is equipped with an antenna installed in the plasma generating chamber that radiates high-frequency waves and an antenna cover that covers the entire antenna and is comprised of an insulating material, in a plasma generator in which the plasma electrode material that has the electron discharge hole is comprised of conductive material, between the plasma electrode and the antenna, in the cylindrical frame region, a frame cover is provided that has protrusions of different thicknesses that are on the inner side or the inner and outer sides of the frame, the material of the frame cover comprising carbon, the frame cover being electrically connected to one of the plasma generating chamber and the plasma electrode, the frame cover protrusions forming shadows on the inner wall of the frame cover, and the formed shadows configured to prevent accumulation of the insulating material of the frame cover, the accumulation being associated with sputtering by the plasma.

* * * * *